United States Patent [19]

Vogen et al.

[11] Patent Number: 5,049,745
[45] Date of Patent: Sep. 17, 1991

[54] PHASE-COMPENSATING VIBRATION CANCELLATION SYSTEM FOR SCANNING ELECTRON MICROSCOPES

[75] Inventors: Wayne V. Vogen, Oakland; Martin D. Mannion, Santa Cruz, both of Calif.

[73] Assignee: Amray, Inc., Bedford, Mass.

[21] Appl. No.: 566,591

[22] Filed: Aug. 13, 1990

Related U.S. Application Data

[63] Continuation-in-part of Ser. No. 270,369, Nov. 14, 1988, Pat. No. 4,948,971.

[51] Int. Cl.$^5$ ............................................. H01J 37/28
[52] U.S. Cl. ..................................... 250/310; 250/311; 250/306; 250/307
[58] Field of Search ................ 250/310, 306, 307, 311

[56] References Cited

U.S. PATENT DOCUMENTS 4,948,971 8/1990 Vogen et al. ...................... 250/310

Primary Examiner—Jack I. Berman
Attorney, Agent, or Firm—Burns, Doane, Swecker & Mathis

[57] ABSTRACT

A system for adjusting the scanning pattern of an electron beam in a scanning electron microscope to decrease image sensitivity to vibrations. In the system, a seismometer is connected to sense displacement velocity caused by vibrations, an integrator is provided for integrating signals from the seismometer, and a phase compensation system is provided for operating upon the integrated signals to provide phase compensated signals that are substantialy 180 degrees out of phase with the sensed vibrations. The phase-compensated signals are used for adjusting the normal scanning pattern of the electron beam microscope to reduce the effects of the sensed vibrations on images provided by the microscope.

19 Claims, 6 Drawing Sheets

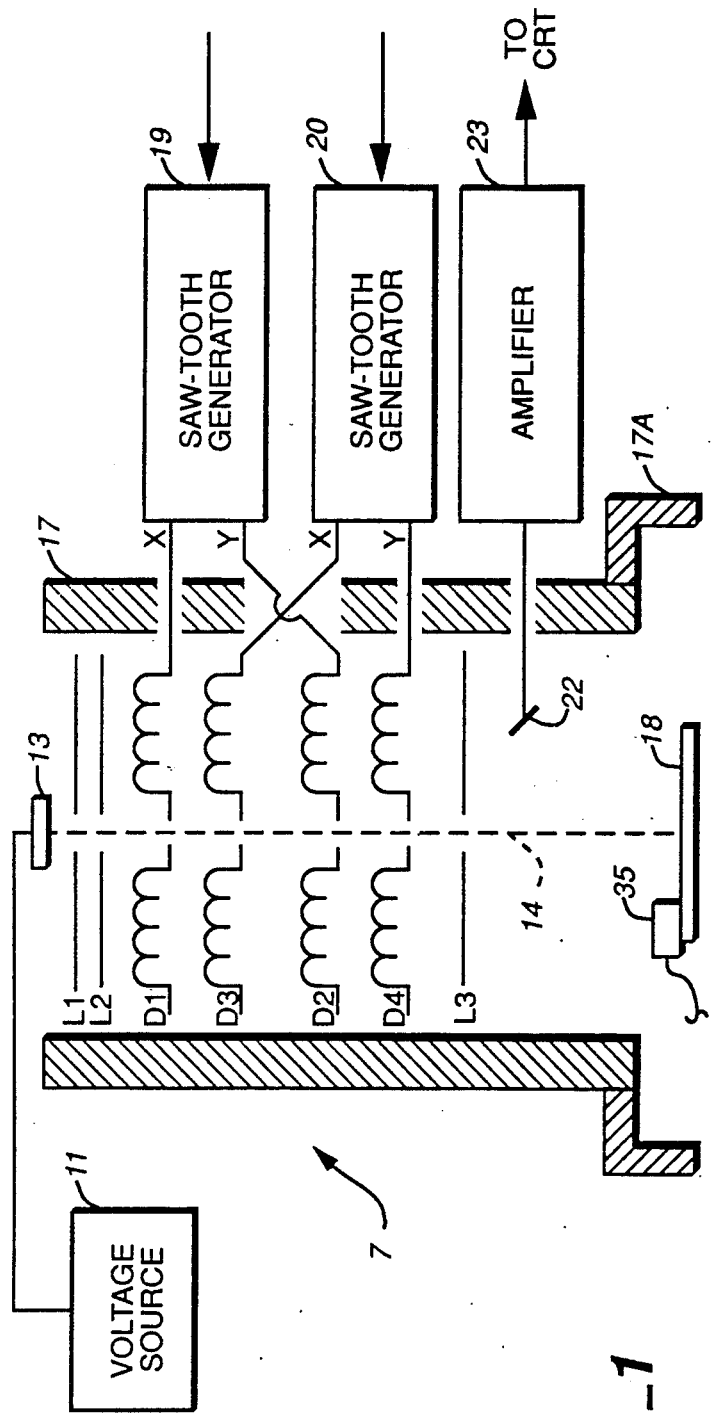
FIG._1
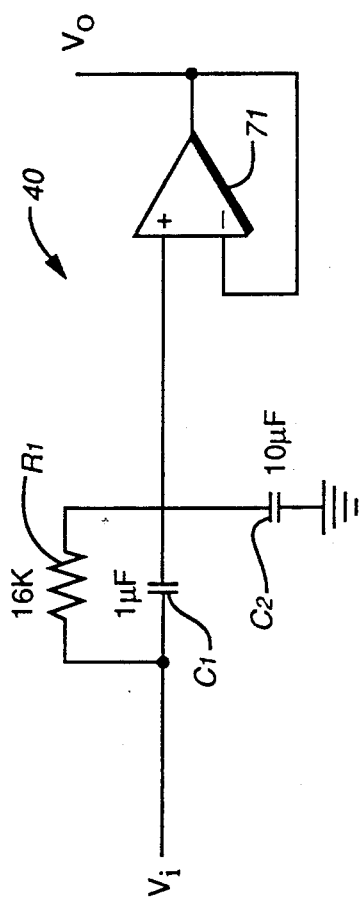
FIG._6

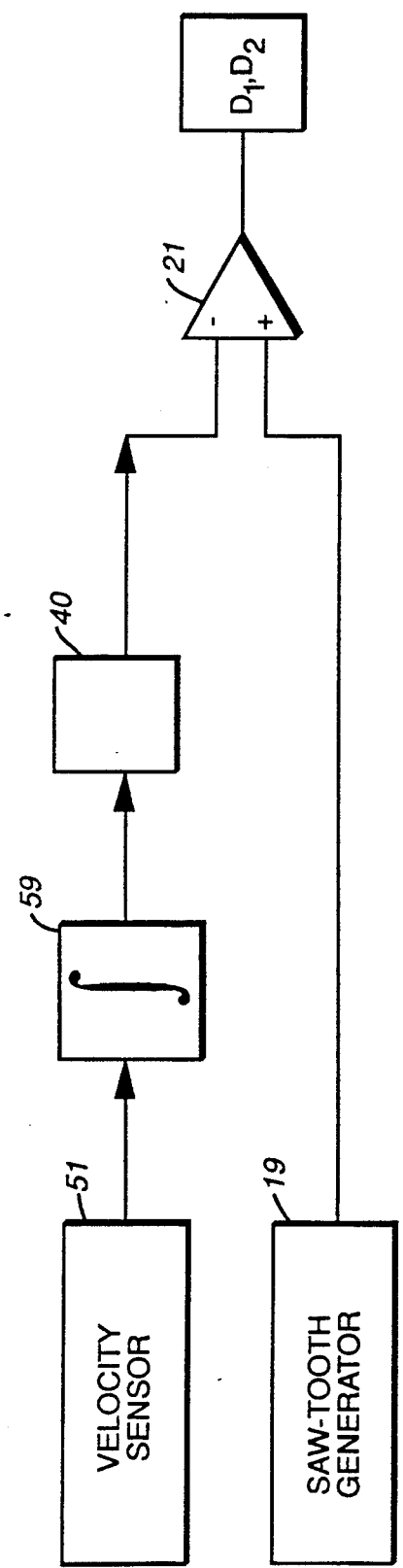
FIG._2
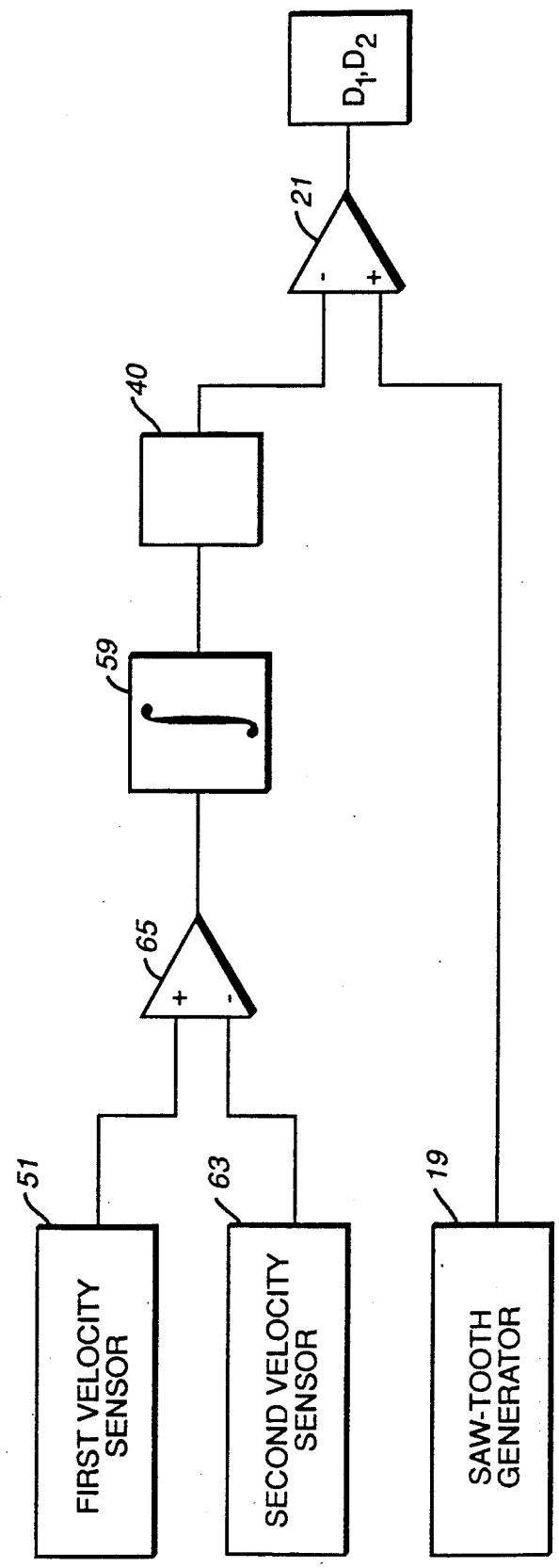
FIG._3

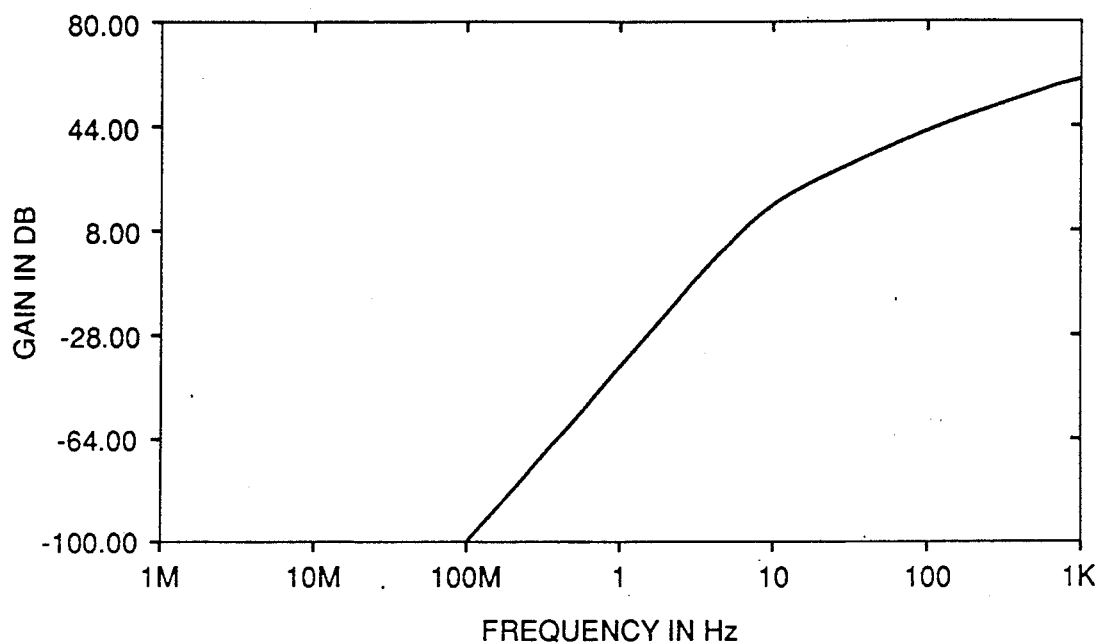
FIG._4A
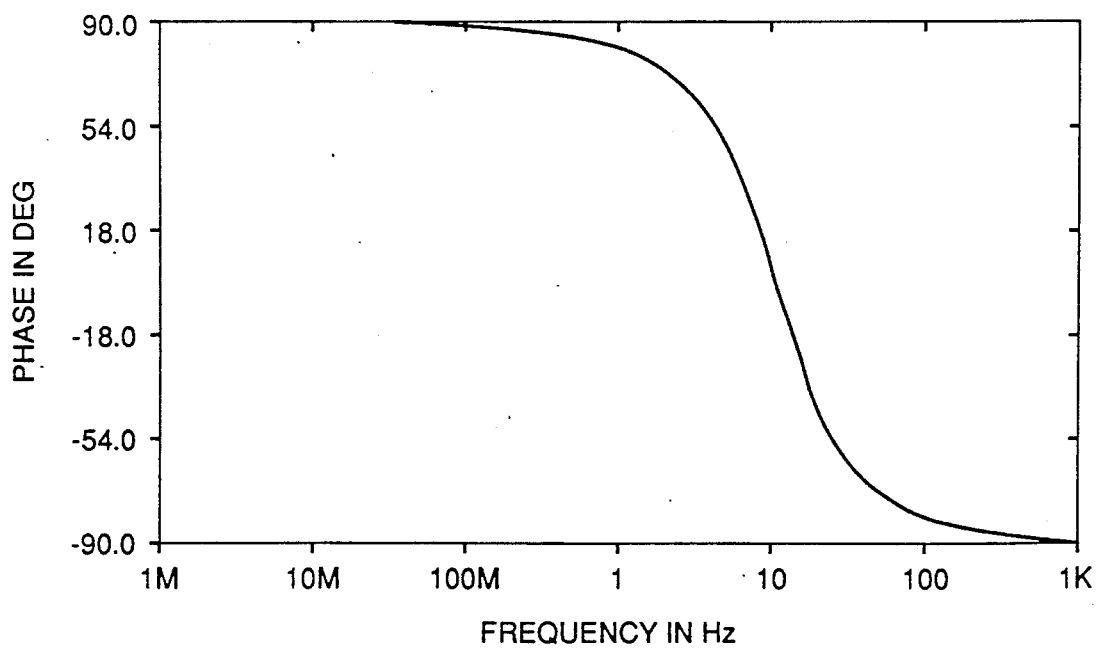
FIG._4B

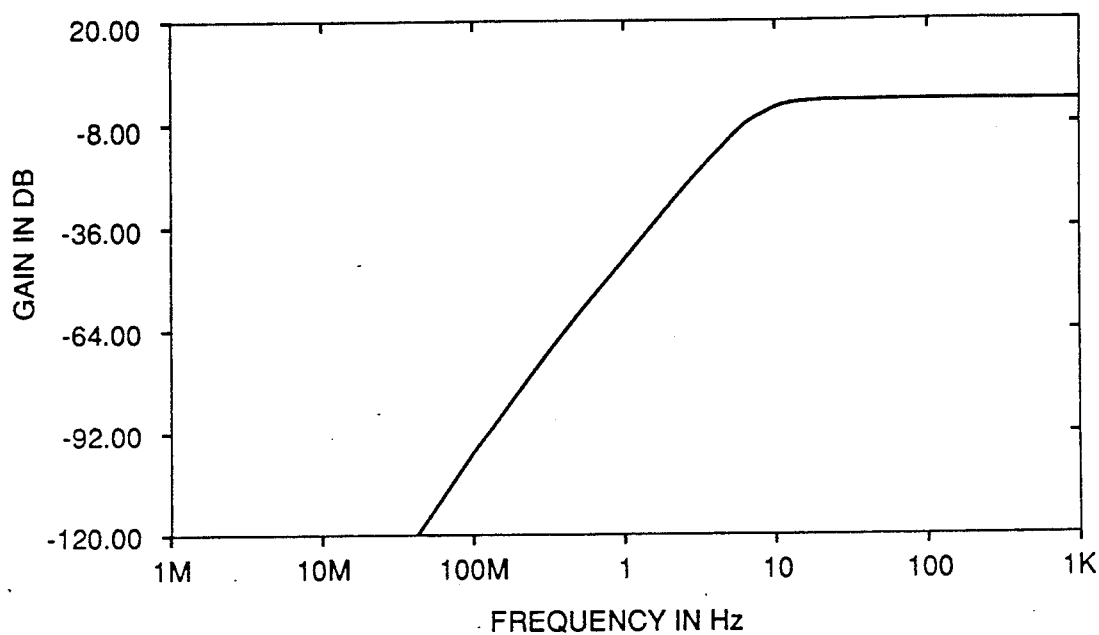
FIG._5A
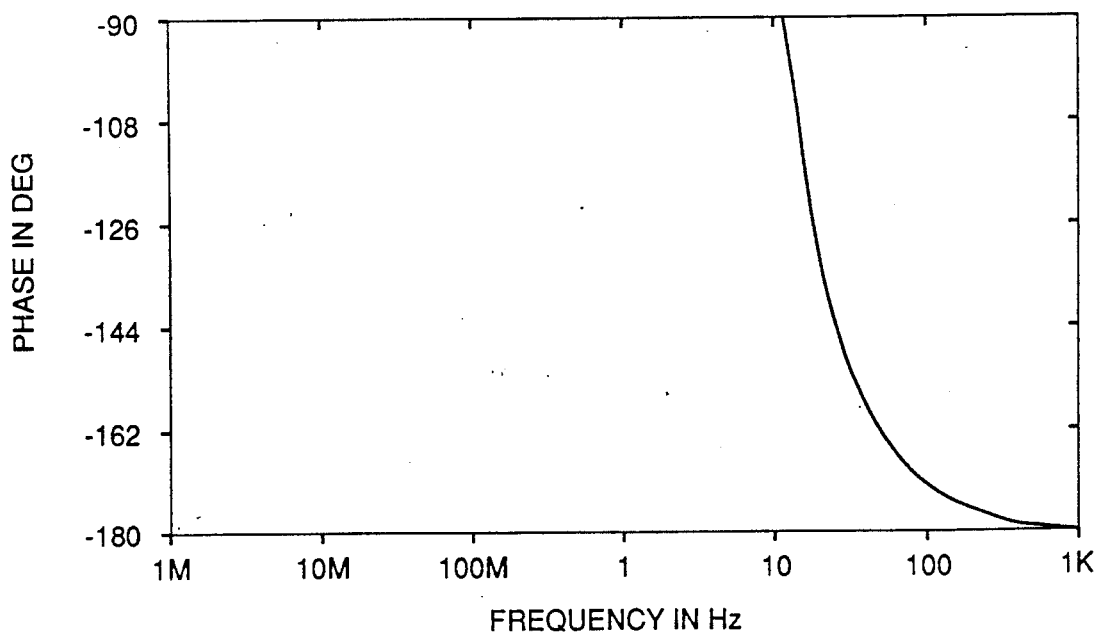
FIG._5B

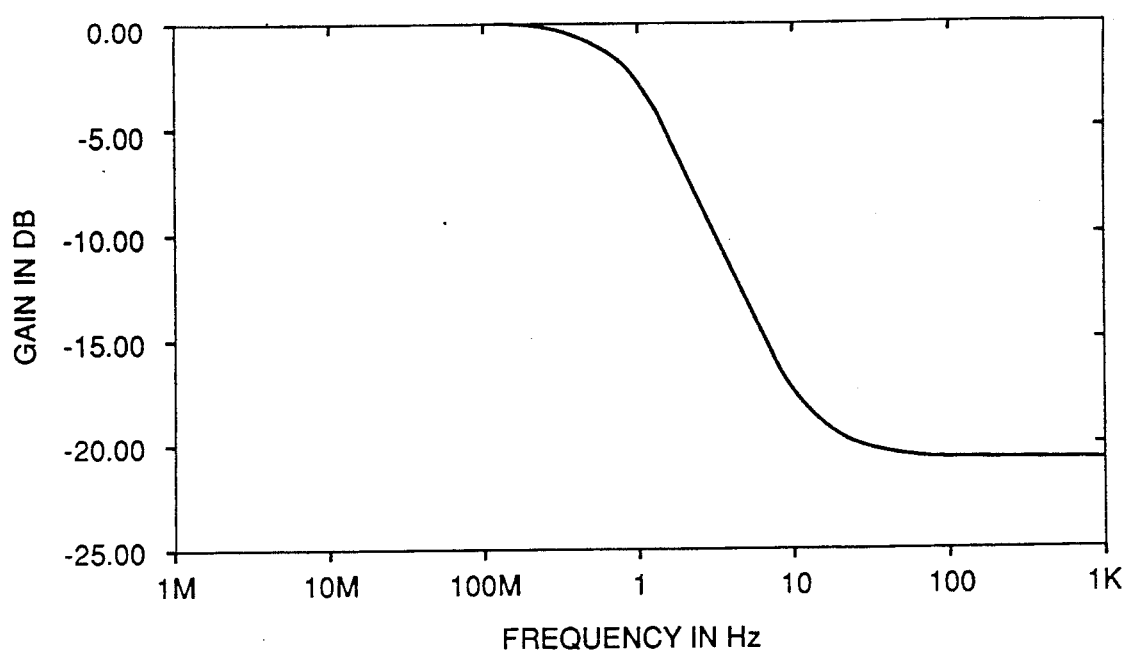
FIG._7A
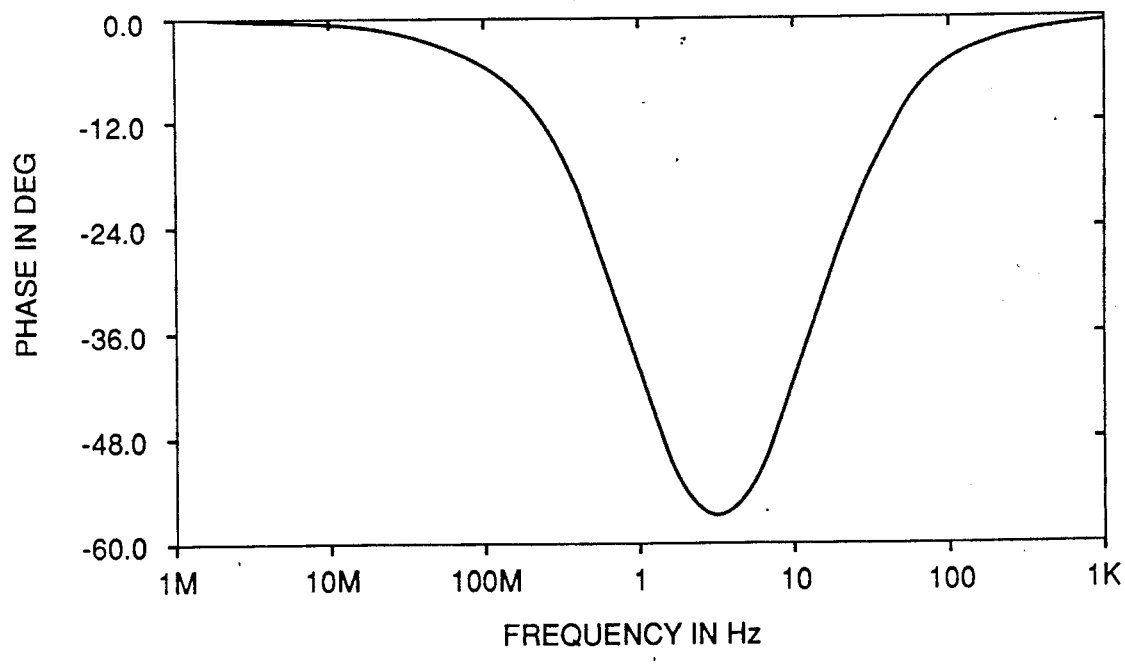
FIG._7B

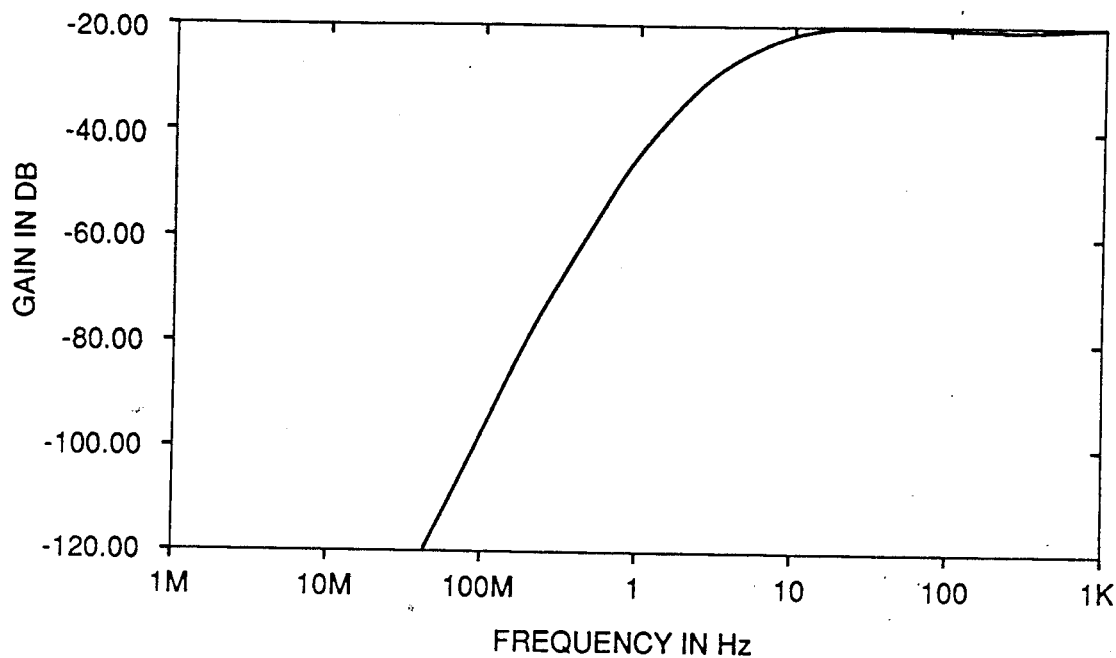
FIG._8A
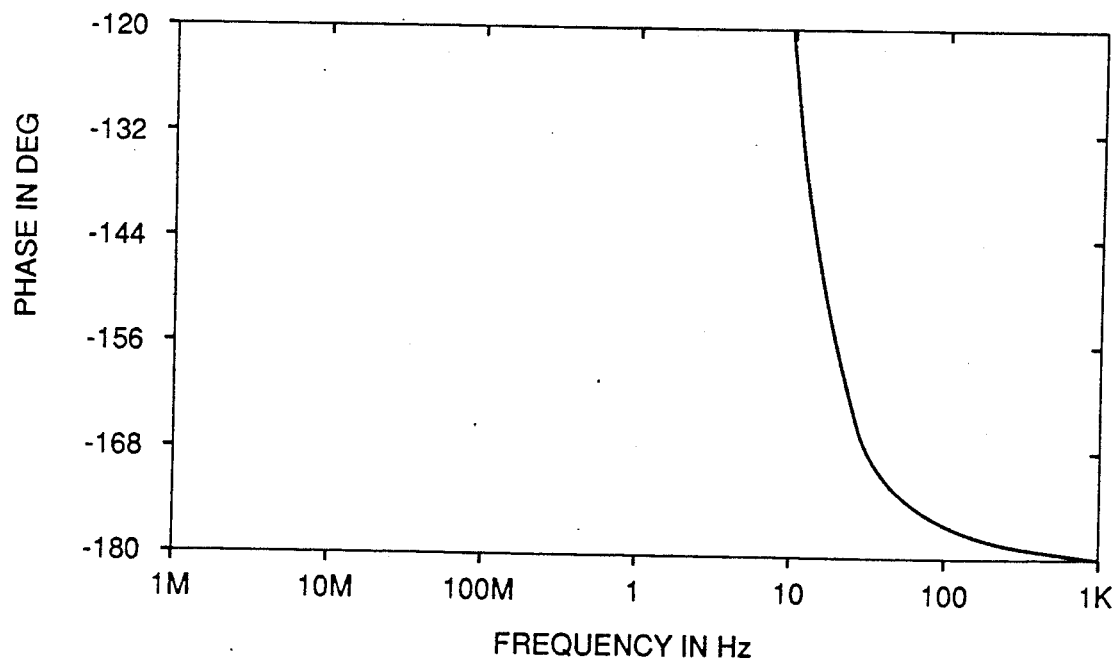
FIG._8B

PHASE-COMPENSATING VIBRATION CANCELLATION SYSTEM FOR SCANNING ELECTRON MICROSCOPES

RELATED APPLICATIONS

This application is a continuation-in-part application based upon U.S. patent application Ser. No. 270,369 filed Nov. 14, 1988, now U.S. Pat. No. 4,948,971, the entire disclosure of which is hereby incorporated by reference.

BACKGROUND OF THE INVENTION

1. Field of the Invention

The present invention relates to scanning electron microscopes and similar instruments that employ scanning electron beams.

2. State of the Art

It is well known to use scanning electron microscopes for measurement and inspection purposes in, for example, the semiconductor manufacturing industry. Scanning electron microscopes, as a result of the short wavelengths of their source electrons, have several advantages over optical microscopes. For example, scanning electron microscopes can achieve resolutions from about 20 to 200 Angstroms, but the limiting resolution of optical microscopes is about 2,500 angstroms (i.e., 0.25 microns). Further, scanning electron microscopes provide depths of field several orders of magnitude greater than optical microscopes.

At the high magnifications that are typical of scanning electron microscopes, image quality can be severely impaired by even slight vibrations. That is, vibrations of a stage with respect to the electron beam in a scanning electron microscope appear in the images produced by the microscope. Although structural (low frequency) vibrations can usually be attenuated by mounting scanning electron microscopes usually on elastic vibration-isolating structures, such structures are not necessarily effective in attenuating acoustic and other high-frequency vibrations.

As is disclosed in the above-identified co-pending application, systems can be provided that use velocity transducers, such as seismometers, to measure the velocity of vibrations in two or more orthogonal directions. In operation of the systems, the velocity signals are integrated to produce signals whose magnitudes are proportional to displacements, and those signals can be used to alter the scanning pattern of an electron beam in such a way as to minimize, or eliminate, the appearance of vibrations in images produced by the scanning electron microscope.

However, as is further explained in the co-pending application, when the signal amplitude gain of a velocity transducer is adjusted such that its output signals vary linearly with the amplitude of sensed vibrations, the phase of the output signals may either lead or lag the vibrations. Moreover, the phase response may vary with the frequency of sensed vibrations.

SUMMARY OF THE INVENTION

Generally speaking, the present invention provides systems to adjust the scanning pattern of an electron beam in instruments such as scanning electron microscopes to decrease image sensitivity to vibrations or similar disturbances.

More particularly, the present invention provides a system for adjusting the scanning pattern of an electron beam in a scanning electron microscope to decrease image sensitivity to vibrations, comprising the following combination of means:

seismometer means connected to the scanning electron microscope to sense the displacement velocity caused by vibrations in at least one direction;

integrator means for integrating output signals form the seismometer means;

phase compensation means for operating upon the integrated output signals to provide phase compensated signals that are substantially 180 degrees out of phase with the sensed vibrations; and beam steering means for receiving and using the phase-compensated signals from the seismometer means to adjust the normal scanning pattern of the electron beam microscope in a way that reduces the effects of the sensed vibrations on images provided by the microscope.

In one preferred embodiment of the present invention, the seismometer means includes at least two seismometers, with one of the seismometer means being arranged to detect vibrations in a first direction and other one arranged to detect vibrations in a second direction which is not parallel to the first direction. In practice, each of the seismometers means has a resonant frequency less than about thirty hertz.

Further in a preferred embodiment of the present invention, the phase compensation means includes a differential operational amplifier which is connected with its output, $V_o$, having negative feedback with unity gain and with the output of the integrator means being received on the amplifier's non-inverting input via the parallel combination of a first capacitor $C_1$ and a resistor $R_1$. Still further in this preferred embodiment, the operational amplifier is connected so that its noninverting input is grounded via a second capacitor $C_2$. As so constructed, the phase compensation means has the following transfer function:

$$\frac{V_o}{V_i} = \frac{1 + sR_1C_1}{1 + sR_1(C_1 + C_2)} = \frac{1 + s\tau_1}{1 + s\tau_2}$$

where the parameter "s" represents the complex frequency, and the parameters $\tau_1$ and $\tau_2$ represent the zeroes and poles, respectively, of the transfer function.

BRIEF DESCRIPTION OF DRAWINGS

The present invention can be further understood with reference to the following description in conjunction with the appended drawings, wherein like elements are provided with the same reference numerals. In the drawings:

FIG. 1 is a generally schematic diagram of a typical scanning electron microscope;

FIG. 2 is a generalized block diagram of one embodiment of a vibration cancellation system according to the present invention for use with the scanning electron microscope of FIG. 1;

FIG. 3 is a generalized block diagram of another embodiment of a vibration cancellation system according to the present invention;

FIG. 4A shows an example of the magnitude and FIG. 4B shows one example of a phase response of a velocity sensor as a function of the frequency of sensed vibrations;

FIG. 5A shows the integrated magnitude and FIG. 5B the phase response of the velocity sensor of FIG. 4 as a function of the frequency of sensed vibrations;

FIG. 6 is a schematic circuit diagram of a phase compensation network for use in the systems of FIGS. 2 and 3;

FIG. 7A shows the magnitude and FIG. 7B the phase response of the phase compensation network of FIG. 6;

FIG. 8A shows the magnitude and FIG. 8B phase response of the system of FIG. 2 employing the phase compensation network of FIG. 6;

DETAILED DESCRIPTION OF THE PREFERRED EMBODIMENT

The scanning electron microscope 7 in FIG. 1 includes a voltage source 11 connected to an electron source 13 that directs a narrow beam of highly accelerated electrons toward a specimen stage 18 via a plurality of electron lenses $L_1$, $L_2$ and $L_3$. (In the illustrated embodiment, the electron beam is indicated by the dashed line 14.) It should be understood that microscope 7 is mounted on an elastic suspension system, not shown, that attenuates structural vibrations having frequencies greater than a few cycles per second (hertz).

As further shown in FIG. 1, a cylindrical column 17 houses the electron source 13 and the lenses $L_1$, $L_2$ and $L_3$. The column 17 is normally referred to as an electron optical column and normally includes a chamber, indicated in the drawing by the number 17A, that surrounds and supports a specimen stage 18. Together, the optical column 17 and the chamber 17A comprise the body of the scanning electron microscope.

The scanning electron microscope 7 of FIG. 1 further includes a deflection system for selectively scanning the electron beam across specimen stage 18. In the illustrated embodiment, the deflection system comprises four pairs of electron beam scanning coils, designated as $D_1$ through $D_4$, located within optical column 17 for focusing the electron beam on the surface of a specimen held on stage 18. In the illustrated embodiment, the pairs of deflection coils $D_1$ and $D_2$ are connected to sawtooth voltage generator 19, and the pairs of deflection coils $D_3$ and $D_4$ are connected to sawtooth voltage generator 20.

The electron beam scanning coils $D_1$ through $D_4$ can be understood to be arranged for deflection the electron beam 14 in two directions which are generally perpendicular. In the drawing, the deflection directions are designated as the x- and y-directions, respectively. The x- and y-directions typically are in a plane perpendicular to the direction of beam 14, but strict orthogonality is not required. For present purposes, it can be assumed that coils $D_1$ and $D_2$ deflect the scanning beam in the x-direction and that coils $D_3$ and $D_4$ deflect the scanning beam in the y-direction.

To reduce the effects of vibrations on the scanning electron microscope of FIG. 1, the specimen stage 18 should be rigidly connected to chamber 17A. Ideally, the stage-to-chamber connecting structure is sufficiently stiff that vibrations affect both the stage and chamber equally and, therefore, do not affect the electron beam scanning pattern. In practice, however, adequate rigidity is not achievable when the specimen stage is moveable or adjustable in a scanning electron microscope.

As still further shown in FIG. 1, an electron collector 22 is arranged near the surface of stage 18 which is exposed to beam 14. The electron collector can be understood to be connected to an amplifier 23 which provides signals to a cathode ray tube (CRT) monitor of the like for displaying images of specimens on stage 18 in real time. Alternatively, collector 22 can be connected to an analog-to-digital converter for transforming the collected electron current to digital signals.

In operation of the scanning electron microscope of FIG. 1, saw-tooth generators 19 and 20 provide time-varying voltage signals to electron beam scanning coils $D_1$–$D_4$ such that beam 14 is deflected across specimen stage 18 in a predetermined scanning pattern. The sawtooth generators 19 and 20 usually operate synchronously to drive the electron beam across stage 18 in the x-direction at a constant rate, with each scan being deflected in the y-direction to form a series of generally parallel scanning lines.

Further in operation of the scanning electron microscope of FIG. 1, collector 22 detects changes in the electron current at stage 18. Thus, as the electron beam scans a specimen on stage 18, the changes in the composition, texture and topography of the specimen cause variations in the amplitude of the electron current detected by collector 22. For a complete scanning sequence, an image corresponding to features of the specimen surface can be created.

Further in practice, vibrations can cause sufficient movement of a specimen stage that the scanning pattern is distorted and resolution is decreased for images provided by a scanning electron microscope. In fact, vibrations that cause displacements as slight as a few nanometers can deleteriously affect resolution at high magnifications. In practice, the range of frequencies of interest is approximately 15 Hz to 150 Hz. At frequencies below 15 Hz, the column and the stage of the instrument tend to move together and, hence, there are no vibrations apparent in the images produced by the microscope. At vibrations above 150 Hz, there are usually no sufficient displacements to cause significant vibrations.

FIGS. 2 and 3 show systems for canceling, in real time, the effects of vibrations on a scanning electron microscope. Typically, the vibrations that require cancellation are ones which exceed about twenty to thirty hertz, but which are below about several hundred hertz. For convenience of illustration, the illustrated systems are simply shown as ones that would cancel vibrations in only one direction, say the x-direction. In practice, similar systems are provided for cancelling vibrations in second and third directions that are non-aligned with the first direction. (Typically, the three directions are mutually perpendicular and are aligned with the respective x, y and z cartesian coordinates.) In cases where the sensors in the vibration-cancellation system are not exactly aligned with the electron beam scanning directions, the sensor outputs can be decoupled for mapping to the scanning directions.

In the vibration cancellation system of FIG. 2, the saw-tooth generator 19 is connected as one input to a summing amplifier 21. The summing amplifier can be, for example, a differential operational amplifier. In turn, summing amplifier 21 is connected to electron beam scanning coils $D_1$ and $D_2$.

Further in the vibration cancellation system of FIG. 2, summing amplifier 21 receives the output of a velocity sensor 51 via an integrator 59 and a phase compensation network 40. Speaking generally, the purpose of integrator 59 is to integrate the velocity signals from velocity sensor 51 to produce signals whose magnitudes are proportional to change in position of sensor 51; that is, to provide signals that indicate the distance which the velocity sensor 51 has moved relative to the inertial reference. Again speaking generally, the purpose of the phase compensation network is to operate upon the integrated output signals to provide phase compensated signals that are substantially 180 degrees out of phase with the sensed vibrations.

In practice, the velocity sensor 51 is a seismometer or geophone which senses vibratory movement relative to an inertial reference. A suitable velocity sensor, for example, comprises a movable coil within a magnet. Also in practice, the gain of integrator 59 is manually adjustable to permit initial tuning of the vibration cancellation system, as is more fully described in co-pending application Ser. No. 270,369.

The velocity sensor 51 usually is connected to stage 18 as shown in FIG. 1 but, alternatively, the sensor can be connected directly to the body of the scanning electron microscope. In the absence of vibrations that cause displacement of stage 18 in the x-direction, velocity sensor 51 does not provide an output that affects the scanning voltage applied to electron beam scanning coils $D_1$ and $D_2$. However, if vibrations cause stage 18 to move in the x-direction within the velocity sensor's sensitivity range, the sensor provides either positive or negative polarity output signals.

As indicated in FIGS. 1-3, the output of summing amplifier 21 is applied to the scanning coils $D_1$ and $D_2$. Alternatively, separate scanning correction coils could be provided to receive the correction signals. In either case, the result is an alteration of the normal scanning pattern of the electron beam in a manner that is intended to cancel the effects of certain vibrations on the scanning electron microscope. In other words, the purpose of providing the integrated and phase-compensated voltage signals is to adjust the scanning pattern of the electron beam of the scanning electron microscope such that, at any instant, the beam is displaced proportionally to the vibration-caused displacement of the microscope's specimen stage, thereby canceling the effects of vibrations on the specimen stage.

Operation of the system of FIG. 2 will now be described for the case where vibrations cause movement of the velocity sensor 51 in the x-direction. Under such circumstances, output signals from velocity sensor 51 are integrated by integrator 59 to produce signals whose magnitudes are linearly proportional to change in position of sensor 51; that is, the instantaneous magnitude of the output of integrator 59 indicates the distance which sensor 51 has moved relative to the inertial reference.

FIG. 3 shows an arrangement of components that are adapted for use with displacement sensors which are sensitive to both relatively low and high frequency vibrations. In this embodiment, it can be understood that first velocity sensor 51 is connected to stage 18 of the microscope of FIG. 1, and a second velocity sensor 63 is connected t the body of the microscope. The output signals from the two velocity sensors 51 and 63 are provided to the non-inverting and inverting inputs, respectively, of an operational amplifier 65. The output of operational amplifier 65 is provided to integrator 59.

Operation of the system of FIG. 3 will now be described for the case where vibrations cause both stage 18 and the body of the microscope of FIG. 1 to move at the same velocity (i.e., in the same direction and at the same speed). In those situations, the two velocity sensors 51 and 63 provide equal outputs which, therefore, cancel one another at differential amplifier 65 and provide no correction to the scanning voltage applied to electron beam scanning coils $D_1$ and $D_2$. It should be noted that, in this case, correction to the scanning pattern is not required because the vibrations do not normally affect the beam scanning pattern.

Operation of the system of FIG. 3 can now be understood for the case where vibrations cause velocity sensor 51 to move in the sensed direction at a different velocity than sensor 63. In that case, amplifier 65 produces output signals which, in magnitude, equal the differential velocity. Thus, when the output of differential amplifier 45 is integrated at integrator 59, signals are produced which, in magnitude, are generally linearly proportional to the relative change in position between sensor 51 and sensor 63.

In either the systems of FIGS. 2 or 3, output signals from the velocity sensors sensor 51, although varying at the same frequency as vibrations that cause movement of stage 18, may either lead or lag the vibrations in phase. The phase difference usually is related to the resonant frequencies of the velocity sensors. For example, when the velocity sensors are seismometers, their output signals normally lag in phase with respect to vibrations whose frequencies are above the sensors' resonant frequency, $f_r$, but normally lead in phase with respect to vibrations whose frequencies are substantially below $f_r$. (The low-frequency behavior of such seismometers may be ignored if the resonant frequency is sufficiently low that the vibrations in the range of the damped frequencies affect both chamber 17 and stage 18 equally.) To completely negate the effects of vibrations on images produced by the scanning electron microscope, the phase correction signals must be exactly 180 degrees out of phase with the actual displacements.

FIG. 4 shows an example of the magnitude and phase response of a typical geophone velocity sensor as a function of the frequency of sensed vibrations. It may be noted that the geophone's resonant frequency, $f_r$, is about ten hertz. Below the resonant frequency, the magnitude response increases at a rate of about sixty decibels (dB) per decade. Above the resonant frequency, the magnitude response increases at a rate of about twenty decibels per decade. The phase response varies from $+90$ degrees at approximately $0.1 f_r$ (i.e., 1 Hz) to $-90$ degrees at $10 f_r$ (100 Hz), and is in phase at $f_r$.

FIG. 5 shows, for the example of FIG. 4, the integrated magnitude and phase response of the geophone velocity sensor as a function of the frequency of sensed vibrations. That is, these plots show the result of integrating the outputs of velocity sensors 51 in FIGS. 2 or 3 with the integrator 59, thereby producing a signal that corresponds to displacement. It should be noted that the integrated magnitude response is generally constant over the range of frequencies of interest, namely 15 Hz to 150 Hz. The phase response decreases from $-90$ degrees at a rate of approximately $-90$ degrees per decade and only approaches $-180$ degrees (the ideal phase response) at a frequency of 100 Hz.

One embodiment of the phase compensation network 40 is shown in FIG. 6. In this embodiment, the network includes a differential operational amplifier 71 which is connected with its output $V_o$ having negative feedback with unity gain. Further, the operational amplifier is connected so that the output, $V_i$, of integrator 59 is received on the amplifier's non-inverting input via the parallel combination of a first capacitor $C_1$ and a resistor R₁. Also, the non-inverting input of the operational amplifier is grounded via a second capacitor $C_2$.

The phase compensation circuit of FIG. 6 has the following transfer function:

$$\frac{V_o}{V_i} = \frac{1 + sR_1C_1}{1 + sR_1(C_1 + C_2)} = \frac{1 + s\tau_1}{1 + s\tau_2}$$

In the transfer function, the parameter "s" represents the complex frequency, and the parameters $\tau_1$ and $\tau_2$ represent the function's zeroes and poles, respectively.

FIG. 7 shows the magnitude and phase response of the phase compensation network of FIG. 6. It should be noted that the magnitude response is generally constant over the range of frequencies of interest and, therefore, does not substantially affect the system magnitude response. The phase response of the compensation network, however, is such as to force the system phase response closer to −180 degrees over the required range.

FIG. 8 shows the magnitude and phase response of the system of FIG. 2 when it employs the phase compensation network of FIG. 6. It should be noted that the system magnitude response is substantially constant over the range of interest (i.e., 10 Hz to 200 Hz) and is relatively close to −180 degrees over the same range.

Although the present invention has been described in its preferred embodiment, those skilled in the art will appreciate that alternative not specifically described in the preferred embodiment may be selected without departing from the spirit and scope of the invention as defined in the appended claims. For example, workers skilled in the art will appreciate that the vibration cancellation system can be applied to instruments other than scanning electron microscopes.

What is claimed is:

1. A system for adjusting the scanning pattern of an electron beam in a scanning electron microscope to decrease image sensitivity to vibrations, comprising:
   at least one seismometer means connected to the scanning electron microscope to sense the displacement velocity caused by vibrations in at least one direction;
   integrator means for integrating output signals from the seismometer means;
   phase compensation means for operating upon the integrated output signals to provide phase compensated signals that are substantially 180 degrees out of phase with the sensed vibrations; and
   beam steering means for receiving and using the phase-compensated signals from the seismometer means to adjust the normal scanning pattern of the electron beam microscope in a way that reduces the effects of the sensed vibrations on images provided by the microscope.

2. A system according to claim 1 wherein the at least one seismometer means includes at least two seismometers.

3. A system according to claim 2 wherein one of the at least two seismometer means is arranged to detect vibrations in a first direction and other one is arranged to detect vibrations in a second direction which is not parallel to the first direction.

4. A system according to claim 2 wherein each of the at least two seismometers is of the type having a moving coil within a magnet.

5. A system according to claim 1 wherein the at least one seismometers means has a resonant frequency less than about thirty hertz.

6. A system according to claim 1 wherein the phase compensation means includes a differential operational amplifier which is connected with its output, $V_o$, having negative feedback with unity gain.

7. A system according to claim 6 wherein the operational amplifier is connected so that the output of the integrator means is received on the amplifier's non-inverting input via the parallel combination of a first capacitor $C_1$ and a resistor $R_1$.

8. A system according to claim 7 wherein the operational amplifier is further connected so that its non-inverting input is grounded via a second capacitor $C_2$.

9. A system according to claim 8 wherein the phase compensation means has the following transfer function:

$$\frac{V_o}{V_i} = \frac{1 + sR_1C_1}{1 + sR_1(C_1 + C_2)} = \frac{1 + s\tau_1}{1 + s\tau_2}$$

where the parameter "s" represents the complex frequency, and the parameters $\tau_1$ and $\tau_2$ represent the zeroes and poles, respectively, of the transfer function.

10. A system for adjusting the scanning pattern of an electron beam in scanning electron microscopes to decrease image sensitivity to vibrations, comprising:
    velocity sensor means connected to the scanning electron microscope to sense vibrations in at least one direction, the velocity sensor means comprising seismometer means having a resonant frequency less than about thirty hertz;
    integrator means to integrate output signals from the velocity sensor means, thereby to indicate displacement of the specimen stage;
    phase compensation means for operating upon the integrated output signals to provide phase compensated signals that are substantially 180 degrees out of phase with the sensed vibrations; and
    beam steering means for using the integrated and phase-compensated voltage signals to adjust the normal scanning pattern of the electron beam of the scanning electron microscope such that, at any instant, the beam is displaced generally proportionally to the vibration-caused displacement of the microscope's specimen stage, thereby canceling the effects of vibrations on the specimen stage.

11. A system according to claim 10 wherein at least two of the velocity sensor means are provided, and one of the velocity sensor means is arranged to detect vibrations in a first direction and another of the velocity sensor means is arranged to detect vibrations in a second direction which is not parallel to the first direction.

12. A system according to claim 11 wherein the phase compensation means includes a differential operational amplifier which is connected with its output, $V_o$, having negative feedback with unity gain.

13. A system according to claim 12 wherein the operational amplifier is connected so that the output of the integrator means is received on the non-inverting input of the amplifier via the parallel combination of a first capacitor $C_1$ and a resistor $R_1$.

14. A system according to claim 13 wherein the operational amplifier is further connected so that its non-inverting input is grounded via a second capacitor $C_2$.

15. A system according to claim 14 wherein the phase compensation means has the following transfer function:

$$\frac{V_o}{V_i} = \frac{1 + sR_1C_1}{1 + sR_1(C_1 + C_2)} = \frac{1 + s\tau_1}{1 + s\tau_2}$$

where the parameter "s" represents the complex frequency, and the parameters $\tau_1$ and $\tau_2$ represent the zeroes and poles, respectively, of the transfer function.

16. A system to decrease the image sensitivity of scanning electron microscopes to vibrations, comprising:
   velocity sensor means connected to the scanning electron microscope to sense vibrations in at least one direction;
   integrator means to integrate output signals from the velocity sensor means, thereby to indicate displacement of the specimen stage;
   phase compensation means for operating upon the integrated output signals to provide phase compensated signals that are substantially 180 degrees out of phase with the sensed vibrations; and
   adjustment means connected to receive output signals from the phase compensation means and operative to adjust image information provided by the microscope in a way which reduces the effects of sensed vibrations.

17. A system according to claim 16 wherein the adjustment means operates in real time to adjust the scanning pattern of the electron beam in the microscope.

18. A method for decreasing the image sensitivity of a scanning electron microscope to vibrations, comprising:
   sensing the velocity of a specimen stage of a scanning electron microscope in at least one direction;
   integrating signals representative of the sensed velocity to indicate displacement of the specimen stage;
   phase compensating the integrated output signals to provide phase compensated signals that are substantially 180 degrees out of phase with the sensed vibrations; and
   adjusting image information provided by the microscope based upon the phase-compensated signals to reduce the effects of sensed vibrations.

19. A method according to claim 23 wherein the adjustment step includes adjusting the scanning pattern of the electron beam in the microscope.

* * * * *